(12) United States Patent
Greim

(10) Patent No.: US 10,209,326 B2
(45) Date of Patent: Feb. 19, 2019

(54) MR COIL

(71) Applicant: Helmut Greim, Adelsdorf (DE)

(72) Inventor: Helmut Greim, Adelsdorf (DE)

(73) Assignee: Siemens Aktiengesellschaft, München (DE)

( * ) Notice: Subject to any disclaimer, the term of this patent is extended or adjusted under 35 U.S.C. 154(b) by 396 days.

(21) Appl. No.: 15/046,840

(22) Filed: Feb. 18, 2016

(65) Prior Publication Data

US 2016/0245884 A1  Aug. 25, 2016

(30) Foreign Application Priority Data

Feb. 19, 2015 (DE) .................. 10 2015 203 015

(51) Int. Cl.
G01R 33/34 (2006.01)
G01R 33/36 (2006.01)
G01R 33/341 (2006.01)

(52) U.S. Cl.
CPC ..... G01R 33/341 (2013.01); G01R 33/34007 (2013.01); G01R 33/34084 (2013.01); G01R 33/3628 (2013.01); G01R 33/3657 (2013.01)

(58) Field of Classification Search
CPC ............ G01R 33/341; G01R 33/34007; G01R 33/34084; G01R 33/3628; G01R 33/3657
USPC .................... 324/322; 600/422, 423
See application file for complete search history.

(56) References Cited

U.S. PATENT DOCUMENTS

| 4,617,936 A * | 10/1986 | Malko .............. G01R 33/34007 324/309 |
| 5,294,886 A | 3/1994 | Duerr |
| 6,469,509 B2 | 10/2002 | Friedrich et al. |
| 2002/0080911 A1 | 6/2002 | Friedrich et al. |
| 2003/0156986 A1* | 8/2003 | Cosman ................ G01R 33/30 422/82.05 |
| 2007/0066883 A1 | 3/2007 | Kimmlingen et al. |
| 2012/0194192 A1 | 8/2012 | Biber et al. |
| 2013/0009644 A1 | 1/2013 | Kawai et al. |
| 2013/0184566 A1 | 7/2013 | Kreischer et al. |

FOREIGN PATENT DOCUMENTS

| DE | 10051155 A1 | 5/2002 |
| DE | 102010033322 A1 | 2/2012 |
| DE | 102012200599 A1 | 7/2013 |
| JP | H03106335 A | 5/1991 |
| JP | 05024003 U | 3/1993 |
| JP | H05180920 A | 7/1993 |
| JP | 2012213581 A | 11/2012 |

OTHER PUBLICATIONS

Shipman, Shape Shifters: NC State Creates New Breed of Antennas, 2009.*

(Continued)

*Primary Examiner* — Susan S Lee

(74) *Attorney, Agent, or Firm* — Lempia Summerfield Katz LLC

(57) ABSTRACT

An MR coil is provided including at least one antenna element. The antenna element has at least one expandable conductor section with a plastic cover and a core including conductive fluid.

16 Claims, 2 Drawing Sheets

(56) References Cited

OTHER PUBLICATIONS

Nordmeyer-Massner et al., Stretchable Coil Arrays: Application to Knee Imaging Under Varying Flexion Angles, 2012, Magnetic Resonance in Medicine, 67:872-879.*
Huber & Suhner, RF Connector Guide, 1996, Chapter 1 and Chapter 6.*
Korean Office Action for related Korean Application No. 10-2016-0019806 dated Sep. 19, 2017.
Korean Office Action for related Korean Application No. 10-2016-0019806 dated May 24, 2017, with English Translation.
Malko, J. A. et. al.: "A Flexible Mercury-Filled Surface Coil for MR Imaging", in: AJNR, vol. 7, pp. 246-247, Mar./ Apr. 1986.
German Office action for related German Application No. 10 2015 203 015.6, dated Nov. 10, 2015, with English Translation.
Chinese Office Action for Chinese Application No. 201610040505.X dated Mar. 30, 2018, with English Translation.

* cited by examiner

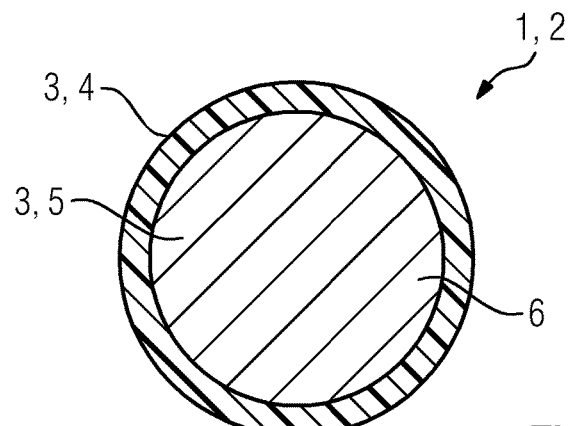
FIG 1
FIG 2
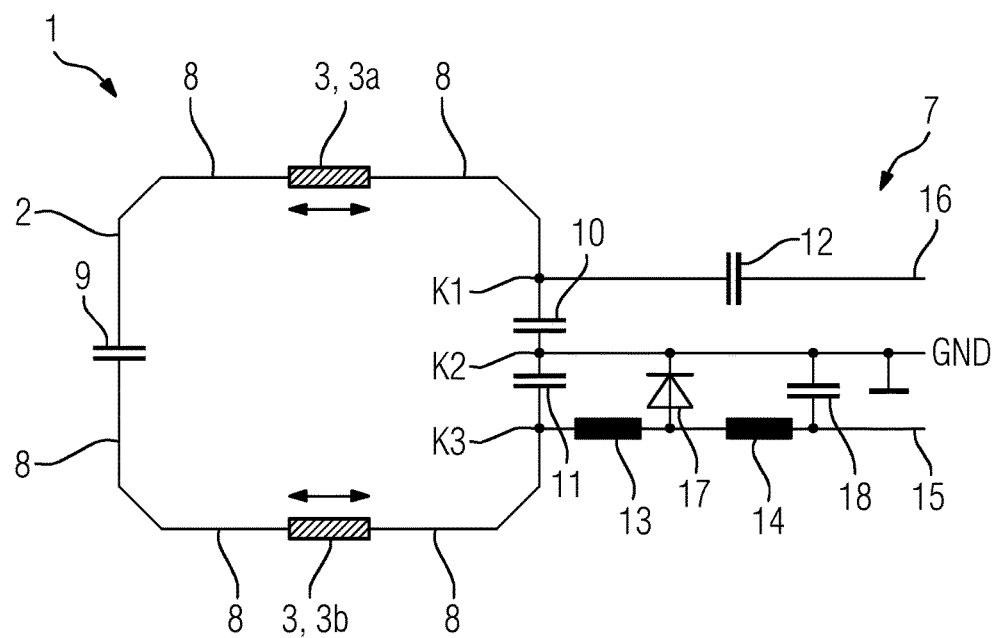

MR COIL

CROSS-REFERENCE TO RELATED APPLICATION

This application claims priority under 35 U.S.C. § 119 to German Patent Application No. 102015203015.6, filed on Feb. 19, 2015, the entire content of which is incorporated herein by reference.

FIELD

The disclosed embodiments relate to a coil, in particular a local coil, for use in magnetic resonance tomography ("MR coil") and having at least one antenna element. The disclosed embodiments may be used, for example, for posterior and/or for anterior positioning of an MR coil on a patient. The MR coil may be a stratified coil mat that may be connected to a patient couch of an MR unit.

BACKGROUND

In magnetic resonance tomography ("MRT," also known as "MR"), high-frequency coils (hereinafter interchangeably called "local coils") are used for receiving alternating magnetic fields. The local coils are sensitive to alternating magnetic fields and have one or more antenna elements with a copper conductor. The individual antenna elements may be embodied as annular loops, (e.g. as loop antennas ("loops")), butterfly-coils, or saddle coils.

In addition to the at least one antenna element, a local coil also may have at least one preamplifier and further electronic devices (RF chokes, etc.). The further electronic devices may include cabling, a housing and one cable with a plug, connecting the local coil to an MRT unit or MRT system. A receiver connected on the system side filters and digitizes the signal received from the local coil and transfers the data to digital signal processing. An image or a spectrum may be derived from the measurement. The derived data may be provided to a user for diagnosis.

In order to obtain a particularly good signal-to-noise ratio, the RF coils are adjusted, with regard to the geometry and receive profile of the RF coils, to different areas of the body and positioned as close as possible to the patient's body. For example, the RF coils may be positioned on the patient (anterior) or under the patient (posterior). The local coils may geometrically cover the area to be investigated as precisely as possible. For example, the local coils may have a larger geometric size for a larger patient and a smaller geometric size for a narrower patient. Conventional local coils are accommodated in a rigid housing or in a plastic casing. Conventional local coils may be flexible but not expandable.

DE 10 2010 033 322 A1 discloses a mechanically flexible MR coil with opening conductor structures for interventional magnetic resonance tomography. The disclosed local coil for a magnetic resonance tomography system has at least one antenna element, with at least one antenna element having a detachable connection to form an opening.

DE 10 2012 200 599 A1 discloses an antenna system for a magnetic resonance imaging system with multiple antenna elements. The antenna elements are arranged in, at, or on support elements. The support elements are not constructed to be expandable and have a constant surface dimension. Adjacent support elements are connected via an expandable connecting element, whereby the dimensions of the connecting element may be changed as a result of expansion.

DE 100 51 155 A discloses a reception coil arrangement for nuclear spin tomography systems with a plurality of selectively pluggable local coils. The local coils with active detuning have a passive detuning circuit for the transmission phase and a passive detuning circuit for the reception phase in the unplugged state. A detuning resonant circuit includes a detuning coil and a capacitor in series with a reverse biased diode that becomes conducting when the coil is connected to the extraction RF cable of the local coil. The detuning coil is dimensioned to form a high-impedance parallel circuit with the matching capacitances of the RF antenna tap, between the terminals thereof.

SUMMARY

The object of the disclosed embodiments is to overcome the disadvantages of the prior art and, at least in part, to provide an improved facility for adjusting the local coil to a patient, easily, and efficiently.

The object is achieved by an MR coil, in particular a local coil, having at least one antenna element, at least one antenna element having at least one expandable conductor section with a plastic cover and a core including conductive fluid. So that the expandable conductor section may be expanded in a linear direction and may be bent if necessary, the antenna element and the MR coil may also be expanded and bent. The antenna element and the MR coil may fit particularly well and snugly to a patient. For example, the slightly differently shaped MR coils hitherto used (e.g. local coils for larger or smaller patients) may be replaced by a single MR coil as described above that may be expanded in accordance with the disclosed embodiments. The core of conductive fluid causes the current to be conducted in a reliable manner. In particular, any resistance of the expandable conductor section may be largely independent of the extent or degree of expansion, even in the case of excessive expansion. Independence of resistance to expansion is advantageous in contrast to expandable conductors made from plastic with incorporated electrically conductive powders. As a result of expansion-independent resistance, the proportionate antenna losses from the expandable conductor section do not increase during expansion and thus have no effect on the signal-to-noise (SNR) ratio. Thus, retuning an adjustment is made easier, if necessary. In particular, in such a case only the frequency may need to be retuned. The expandable conductor section may be expanded by several times its length without malfunctioning.

The expandable conductor section may be a wire piece or wire section.

At least one microfluid channel filled with the conductive fluid may, for example, be present in the plastic.

In some embodiments, the conductive fluid is a metallic fluid or liquid metal, facilitating a particularly low resistance. In addition, such a conductor section conducts electricity particularly reliably.

In another embodiment, the conductive fluid is a non-magnetic fluid. Non-magnetic fluid is advantageous for MR imaging, since image artifacts are thereby avoided.

In some embodiments, the metallic fluid contains or comprises gallium (Ga). Gallium melts at raised room temperatures, i.e. at approximately 30° C. Thus, gallium may already be in liquid form or may become liquid in typical MR applications without additives or with only small quantities of additives.

In a further embodiment, the metallic fluid comprises or is a gallium-indium (In) mixture, in particular a Ga—In alloy. The Ga—In mixture is a good conductor. Both metals are non-magnetic, a highly advantageous feature for MR imaging. The Ga—In alloy is present in particular as a eutectic that significantly lowers the melting point of gallium. Depending on the gallium and/or indium content, the melting point can be reduced by 3 to 5° C. (with a Ga content of approximately 75%). Such a conductor may, for example, be expanded by up to eight times its nominal or normal length.

The use of a Ga—In mixture provides the further advantage that, if the plastic cover is damaged, an oxide layer of the metal develops at the point of damage, preventing any further leakage of the mixture.

In some embodiments, a reflection factor of at least one antenna element or for at least one antenna element is set in a range of between 40% and 60%, in particular at approx. 50%. The reflection factor is therefore not set to e.g. a possible 10% (corresponding to −20 dB) but only to 40% and 60%, in particular to 50% (corresponding to −6 dB). The at least one antenna element may be connected to an adapter (e.g. a matching network or circuit), and the adjustment may be set over a wide band, accordingly. Tracking of an adjustment can thus be avoided, since, during tuning, the adjustment is set somewhat more imprecisely and therefore over a wider band from the outset. Advantage is taken of the fact that, during expansion, the antenna size (e.g., a resonance frequency of the coil) is modified, but the amount of the reflection factor remains virtually the same. Consequently, if a low-noise preamplifier is used, the amplification and the signal-to-noise ratio will not change significantly, despite any expansion.

A further embodiment includes an additional expandable conductor section. The resistance is variable during expansion, in addition to the least one antenna element. The additional expandable conductor section has a rather disadvantageous characteristic for an expandable conductor section of the antenna element, in that the additional expandable conductor section changes its resistance appreciably, and possibly significantly, during expansion. Thus, simply and compactly, an allowance may be made for a degree of expansion in the area at least alongside the adjacent antenna element and to adjust any settings of the MR coil or of the at least one adjacent antenna element. The additional expandable conductor section may be connected to a control circuit, e.g. to a control amplifier, or may form part of such a control circuit. The control circuit may be connected on the output side to a matching network for at least one antenna element or part of the matching network.

The additional expandable conductor section may assume virtually any orientation with respect to the at least one expandable conductor section of the antenna element. The conductor sections may therefore be arranged in parallel to one another. The expandable conductor sections may be arranged on a common, in particular expandable, substrate.

In some embodiments, the additional expandable conductor section has a wave-like characteristic (e.g., a sinusoidal, rectangular or meandering characteristic). Advantageously, a particularly large change in resistance is achieved over a short, straight length.

In another embodiment, the additional expandable conductor section contains plastic as the matrix material, with incorporated electrically conductive powders as the filling material. Such a conductor section can be implemented compactly, economically, and robustly.

In some embodiments, a direct current ("d.c." or "DC") voltage may be applied to the additional expandable conductor sections, and a control voltage may be generated from the resulting current or from a current change via a differential amplifier. Thus, one or more parameters or components (e.g. of a matching network) may be adjusted to desired target values or a target range, maintaining the uniformity of a receive characteristic of at least one antenna element, even if the expansion changes.

In a further embodiment, the MR coil also includes: a capacitance diode switched in parallel to a fixed, frequency-determining capacitor of a matching network. The capacitance diode can be controlled by the control voltage in such a way to compensate for frequency change caused by the expansion. In particular, (e.g. with the help of the control voltage) the capacitance diode may be controlled such that, by the capacitance diode, the frequency change caused by the expansion may be compensated. The reflection factor of the adjustment may thus be kept very low across the entire application area.

The MR coil may in particular exist as a malleable layer or mat (e.g., for anterior and/or posterior positioning on a patient).

The characteristics, features and advantages of this invention as described above, and the manner in which these are achieved, may be understood more clearly and explicitly in conjunction with the following schematic description of exemplary embodiments, which are explained in greater detail in conjunction with the drawings. For the purpose of clarity, identical or similar elements are labeled with the same reference characters.

The scope of the present invention is defined solely by the appended claims and is not affected to any degree by the statements within this summary. The present embodiments may obviate one or more of the drawbacks or limitations in the related art.

DESCRIPTION OF THE FIGURES

FIG. 1 depicts a cross-sectional view of an expandable conductor section of an antenna element of an embodiment of an MR coil;

FIG. 2 depicts a circuit diagram of an antenna element with a corresponding matching network of the MR coil according to an embodiment.

DETAILED DESCRIPTION

Figure 3:
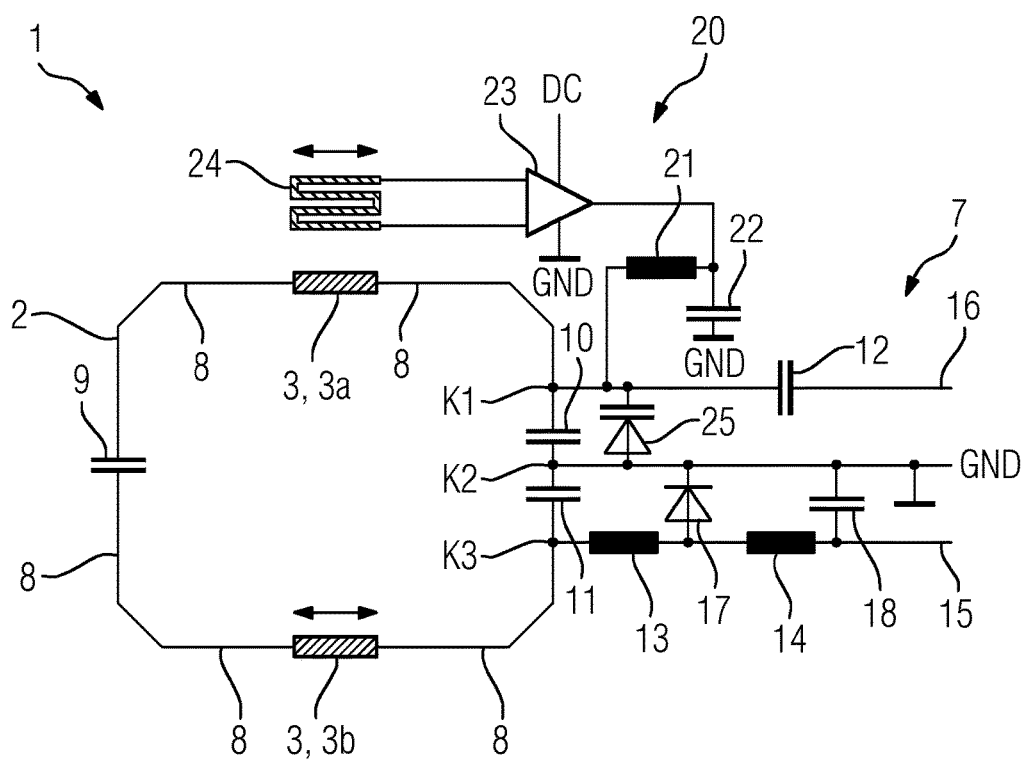
FIG. 3 depicts a circuit diagram of the antenna elements with a corresponding matching network of the MR coil according to an another embodiment.

FIG. 1 is a cross-sectional diagram illustrating a cross-section through an expandable conductor section 3 of an antenna element 2 of an MR coil 1. The expandable conductor section 3 has a hose-like or tubular plastic cover 4 and a core 5. The core 5, (e.g. a microfluid channel) is filled with an alloy in the form of a Ga—In eutectic 6. The Ga—In eutectic 6 may be liquid at normal temperatures of magnetic resonance tomography examinations and is therefore a high-grade, conductive, metallic fluid. The Ga—In eutectic 6 may also be non-magnetic. The conductor section 3 may be expanded by up to eight times its normal or nominal length (perpendicular to the image plane). If the plastic cover 4 is damaged, an oxide layer advantageously forms on the GA—In eutectic 6, preventing any further leakage from the plastic cover 4.

FIG. 2 illustrates a circuit diagram of the antenna element 2 of the MR coil 1 with a corresponding matching network 7 according to an exemplary embodiment. The antenna element 2 has a loop-shaped conductor 3, 8 with a first expandable conductor section 3, 3a and a second expandable conductor section 3, 3b, connected in series to other conductor sections 8. Other conductor sections 8 may be embodied, for example, as wires, cables or tracks. Other conductor sections 8 may be present as copper wires or other copper conductors. The expandable conductor sections 3 can expand in a linear manner at least in the direction indicated by the double arrows.

Between the expandable conductor sections 3a and 3b there is a capacitor 9 on one side (without limiting generality, may also be called a "reduction capacitor" herein) and two capacitors connected in series on the other side, namely a capacitor 10 (e.g., a fixed, frequency-determining capacitor) and a capacitor 11 (without limiting generality, may also be called a "detuning capacitor" herein).

An additional capacitor 12 is connected between the first expandable conductor section 3, 3a and the capacitor 10, e.g. via a node K1. The capacitor 12 may be used for adjusting a resistive load.

A node K2 between the two capacitors 10 and 11 is connected to a reference potential such as ground GND.

A coil 13 (without limiting generality, may also be referred to as a "detuning coil" herein) is also connected between the second expandable conductor section 3, 3a and the detuning capacitor 11, e.g. via a node K3. The detuning coil 13, on the other hand, is connected to a connection 15 via a choke 14. The connection 15 may be used as a d.c. voltage input.

The additional capacitor 12 may be connected to an additional connection 16, e.g. to a signal input.

An anode of a diode (in particular an RF diode, e.g. a PIN diode) 17 is switched between the detuning coil 13 and the choke 14. The cathode of the diode is connected to ground GND.

A capacitor 18 (e.g., a block capacitor), having one end connected to ground GND, is switched between the choke 14 and the connection 15.

The connection 16 may be used as a high-frequency signal output, e.g. for outputting an RF signal induced by the antenna element. The antenna element 2 may thus be used in particular as a pure receive antenna and/or as a combined transmit/receive antenna.

The matching network 7 may in particular have or comprise the elements 10 to 18.

The reflection factor for antenna element 2 is set at approx. 50%. Tracking of an adjustment and/or of the matching network 7 may thus be avoided. That is, during tuning, the reflection factor is set somewhat more imprecisely and therefore over a wider band from the outset.

FIG. 3 illustrates a circuit diagram of the antenna element 2 of the coil 1, including a control circuit 20 in addition to the matching network 7. The control circuit 20 may also be regarded as part of the matching network 7.

The control circuit 20 has an additional choke 21, an additional capacitor 22, a control amplifier 23 and an additional expandable conductor section 24. The matching network 7 additionally has a capacitance diode 25.

The additional expandable conductor section 24 is expandable in the same direction as the expandable conductor sections 3a and 3b of the antenna element 2 and may be expanded together with expandable conductor sections 3a and 3b. The resistance of the additional expandable conductor section 24, in contrast to the conductor sections 3a and 3b, may vary considerably during expansion. The variance in resistance during expansion is helped by the fact that the additional expandable conductor section 24 has a wave-like characteristic. The additional expandable conductor section 24 may be made of a plastic as the matrix material with incorporated electrically conductive powders.

The conductor section 24 is connected to inputs of the control amplifier 23. A direct current DC may be applied to the conductor section 24 (e.g. via the control amplifier 23). By the current thus generated, a control voltage may be generated by the conductor section 24 via the control amplifier 23. The control voltage is supplied at an output of the control amplifier 23. Since the current varies significantly during expansion of the conductor section 24, the level of the control voltage is also dependent on the resistance of the additional expandable conductor section 24. A control voltage of a modification of the control voltage may therefore be generated during expansion of the antenna element 2 and therefore also of the adjacent conductor section 24, due to the resulting current change, via the differential amplifier 23.

The capacitance diode 25 is switched in parallel to the frequency-determining capacitor 10 and is connected both to the node K1 and to ground GND. The node K1 is connected via the choke 21 to the output of the control amplifier 23. The capacitor 22 is also connected both to the output of the control amplifier 23 and also to ground GND. The capacitance diode 25 may be controlled by the control voltage in such a way to compensate for any frequency change caused by the expansion of the conductor sections 3a and 3b. The reflection factor of the adjustment may thus be kept very low across the entire application area. In particular, the reflection factor can thus, for example, be kept at 10% (corresponding to −20 dB), without the amplification and the signal-to-noise ratio changing significantly.

Even though the invention is illustrated and described in detail by the exemplary embodiments shown, the invention is not restricted to them and other variations may be derived therefrom by a person skilled in the art, without departing from the protective scope of the disclosed embodiments.

Multiple matching networks of different antenna elements may also be controlled or regulated by a control circuit. Antenna elements other than adjacent antenna elements may also be controlled.

In general, the word "a", means singular or plural, particularly in the sense of "at least one" or "one or more", etc., unless otherwise specified, e.g. by the expression "precisely one", etc.

A stated number also includes the exact number specified as well as a normal tolerance range, unless otherwise specified.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

I claim:

1. A magnetic resonance (MR) coil, comprising:
   at least one antenna element, wherein the at least one antenna element comprises an expandable conductor section and an additional expandable conductor section, wherein the expandable conductor section comprises a plastic cover; and
   a core comprising a conductive fluid,
   wherein the at least one antenna element and the additional expandable conductor section are each configured to have a varying resistance during expansion.

2. The MR coil of claim 1, wherein the conductive fluid is a metallic fluid.

3. The MR coil of claim 1, wherein the conductive fluid is a non-magnetic fluid.

4. The MR coil of claim 2, wherein the metallic fluid comprises a GA—In alloy.

5. The MR coil of claim 4, wherein a reflection factor of the at least one antenna element is set to a range between 40% and 60%.

6. The MR coil of claim 2, wherein the conductive fluid is a non-magnetic fluid.

7. The MR coil of claim 2, wherein the metallic fluid consists of a Ga—In alloy.

8. The MR coil of claim 2, wherein a reflection factor of the at least one antenna element is set to a range between 40% and 60%.

9. The MR coil of claim 3, wherein a reflection factor of the at least one antenna element is set to a range between 40% and 60%.

10. The MR coil of claim 1, wherein the additional expandable conductor section has a wave-like characteristic.

11. The MR coil of claim 10, wherein the additional expandable conductor section comprises a plastic incorporating electrically conductive powders.

12. The MR coil of claim 1, wherein the additional expandable conductor section comprises a plastic incorporating electrically conductive powders.

13. The MR coil of claim 1, wherein a direct current is applied to the additional expandable conductor section, and
    wherein a control voltage is generated from a current change via a differential amplifier.

14. The MR coil of claim 13, further comprising:
    a capacitance diode switched in parallel to a fixed frequency-determining capacitor of a matching network,
    wherein the capacitance diode is controlled via the control voltage to compensate for any frequency change caused by expansion.

15. A magnetic resonance (MR) coil, comprising:
    at least one antenna element, wherein the at least one antenna element comprises at least one expandable conductor section, wherein the at least one expandable conductor section comprises a plastic cover; and
    a core comprising a conductive fluid,
    wherein a reflection factor of the at least one antenna element is set to a range between 40% and 60%.

16. The MR coil of claim 15, further comprising:
    at least one additional expandable conductor section,
    wherein the at least one antenna element and the at least one additional expandable conductor section are each configured to have a varying resistance during expansion.

* * * * *